(12) United States Patent
Thornton et al.

(10) Patent No.: US 7,367,511 B2
(45) Date of Patent: May 6, 2008

(54) INTERFACE CARD DESIGN AND METHOD OF MANUFACTURE

(75) Inventors: Curtis W. Thornton, Raleigh, NC (US); Brian Mellage, Raleigh, NC (US); Gerard Hayes, Wake Forest, NC (US)

(73) Assignee: Sony Ericsson Mobile Communication AB, Lund (SE)

( * ) Notice: Subject to any disclaimer, the term of this patent is extended or adjusted under 35 U.S.C. 154(b) by 225 days.

(21) Appl. No.: 11/160,083

(22) Filed: Jun. 8, 2005

(65) Prior Publication Data

US 2006/0278719 A1 Dec. 14, 2006

(51) Int. Cl.
*G06K 19/00* (2006.01)

(52) U.S. Cl. .............. 235/487; 235/492; 235/486

(58) Field of Classification Search ........... 235/487, 235/492, 380, 486; 361/737; 257/678
See application file for complete search history.

(56) References Cited

U.S. PATENT DOCUMENTS

| | | | | |
|---|---|---|---|---|
| 5,537,293 | A | * | 7/1996 | Kobayashi et al. ......... 361/737 |
| 5,760,381 | A | * | 6/1998 | Stich et al. ................. 235/380 |
| 5,923,534 | A | * | 7/1999 | Yajima ....................... 361/737 |
| 6,018,461 | A | | 1/2000 | Biermann et al. |
| 6,104,617 | A | * | 8/2000 | Schremmer ................ 361/737 |
| 6,122,178 | A | | 9/2000 | Andrews et al. |
| 6,266,017 | B1 | * | 7/2001 | Aldous ....................... 343/702 |
| 6,389,486 | B1 | | 5/2002 | Petty |
| 6,444,501 | B1 | * | 9/2002 | Bolken ....................... 438/127 |
| 6,618,013 | B1 | * | 9/2003 | Aldous ....................... 343/702 |
| 6,768,644 | B2 | * | 7/2004 | Kakinoki et al. ........... 361/737 |
| 6,834,810 | B2 | * | 12/2004 | Maruyama ................ 235/492 |
| 7,032,817 | B2 | * | 4/2006 | Blank ........................ 235/380 |
| 2004/0056102 | A1 | * | 3/2004 | Cheung ....................... 235/486 |

FOREIGN PATENT DOCUMENTS

| | | |
|---|---|---|
| EP | 1158628 | 11/2001 |
| EP | 1538883 | 6/2005 |

OTHER PUBLICATIONS

PCT International Search Report for corresponding PCT application, PCT/US2006/002116, May 15, 2006.
PCT Written Opinion for corresponding PCT application, PCT/US2006/002116, May 15, 2006.
PCT International Preliminary Report on Patentability for corresponding PCT application, PCT/US2006/002116, Sep. 24, 2007.

* cited by examiner

*Primary Examiner*—Ahshik Kim
(74) *Attorney, Agent, or Firm*—Moore & Van Allen PLLC; Dennis J. Williamson; Steven B. Phillips

(57) ABSTRACT

An interface card is manufactured with a frame that includes an exposed mounting area on the card extension for receiving a customized cover plate. The cover plate includes customer specific information such as branding information, customer name, logos, trademarks or the like. The cover plate is secured to the card mounting area after manufacture of the card such that the card can be of a generic, non-customer specific design. In one embodiment of the cover plate, the cover plate is formed with a cover that is hinged to the cover plate and can be selectively opened by the end user to reveal elements on the card such as an RF connector.

21 Claims, 5 Drawing Sheets

INTERFACE CARD DESIGN AND METHOD OF MANUFACTURE

BACKGROUND

The invention relates generally to peripheral devices and interface cards such as PC cards and more particularly to an improved mechanical design for such cards.

Electronic devices may use various peripheral devices or interface cards to increase flexibility and adaptability to various work environments. This may be especially true for computing devices such as handheld computer terminals, laptop computers and vehicle mounted devices. Prior to development of standards for connecting peripheral devices to computers, computers often accepted only limited models and brands of peripheral devices. For example, memory cards often were designed to be plugged only into specific computer models.

A need to standardize the connection of peripheral devices to computing devices was soon recognized. Initially, the standardization of interchangeable memory cards was developed. These interchangeable memory cards were sometimes used in lieu of floppy diskettes for exchanging data or for expanding the memory of a computing device. The Personal Computer Memory Card International Association (PCMCIA) was formed by several memory card manufacturers in the late 1980s to define memory card physical design, computer socket design, electrical interface, and associated software (referred to as the PCMCIA interface standard). Today PCMCIA (Personal Computer Memory Card International Association) is an organization consisting of some 500 companies that has developed a standard for PC cards. Although originally designed for adding memory to portable computers, the PCMCIA standard has been expanded several times and is now suitable for many types of devices including modems, sound cards, floppy disk controllers, hard drives, Global Positioning System (GPS) cards, local area network (LAN) cards, pagers, and radiotelephone cards, among others.

There are three types of PC cards. All three types of cards have the same rectangular size (85.6 by 54 millimeters), but are different widths. Type I cards can be up to 3.3 mm thick, and are used primarily for adding additional ROM or RAM to a computer. Type II cards can be up to 5.5 mm thick. These cards are often used for modem and fax modem cards. Type III cards can be up to 10.5 mm thick, which is sufficiently large for portable disk drives. Likewise, PCMCIA slots in the receiving electronic devices also come in three sizes. A Type I slot can hold one Type I card. A Type II slot can hold one Type II card or one Type I card. A Type III slot can hold one Type III card or any combination of two Type I or II cards. An electronic interface which provides a female portion of a connector is provided on the PC card that mates with a male portion of the connector in the slot of the receiving device.

While a specific standard peripheral device, the PC card, has been described, it is to be understood that other peripheral devices or interface cards based on other standards or proprietary designs are known. These peripheral devices and interface cards are referred to herein inclusively as "cards".

It will be understood that these cards may be manufactured by a manufacturing entity (hereinafter "manufacturer") for sale to its customers where the customers, in turn, sell the cards at the retail level. Often the manufacturer will manufacture the same or similar cards for many different customers. Each customer typically requires that the manufacturer includes customer specific branding information such as logo, color scheme and trademark on each card. Because the manufacturer must comply with different branding requirements for different customers, the manufacturer has been required to maintain separate part numbers, drawings and inventory stock for the cards of each of its customers. The maintenance of separate card designs and inventories for each customer is expensive and inefficient and creates added overhead and supply chain complexity for the manufacturer. Moreover, manufacturing lead time is increased because customer-specific cards may not be manufactured until an order is received from that customer.

One attempt to address this issue is the use of stickers applied to the case of the card where the sticker contains some customer information. While the use of stickers addresses some of the manufacturer issues, the stickers are not considered acceptable by the customers because the stickers are not perceived to present the customer information in a permanent and high quality manner. Moreover, when the sticker is applied to the case of the card, it is not visible when the card is inserted in the electronic device thereby limiting the impact of the branding information.

Thus, an improved card construction that simplifies the manufacturing process is desired.

SUMMARY

The invention comprises a card that is manufactured with a frame that includes a card extension formed with a mounting area for receiving a customized cover plate. The cover plate includes customer specific information such as branding information, customer name, logos, trademarks or the like. The cover plate is secured to the card mounting area after manufacture of the card such that the card can be of a generic, non-customer specific design. Use of the customer specific cover plate simplifies the manufacturing process by eliminating the need to manufacture and maintain cards that are customer specific. The only part that is customer specific is the cover plate which is relatively simple and inexpensive to manufacture. The cover plate is secured to the card upon receipt of an order by the customer such that the manufacturer does not have to maintain and balance inventories of different cards for different customers. The use of the cover plate presents the customer information in a manner that is permanent, highly visible and of a quality that is acceptable to the customer. In one embodiment of the cover plate, the cover plate is formed with a cover that is hinged to the cover plate and can be selectively opened by the end user to reveal elements on the card such as an RF connector.

DETAILED DESCRIPTION OF PREFERRED EMBODIMENTS OF THE INVENTION

Figure 1:
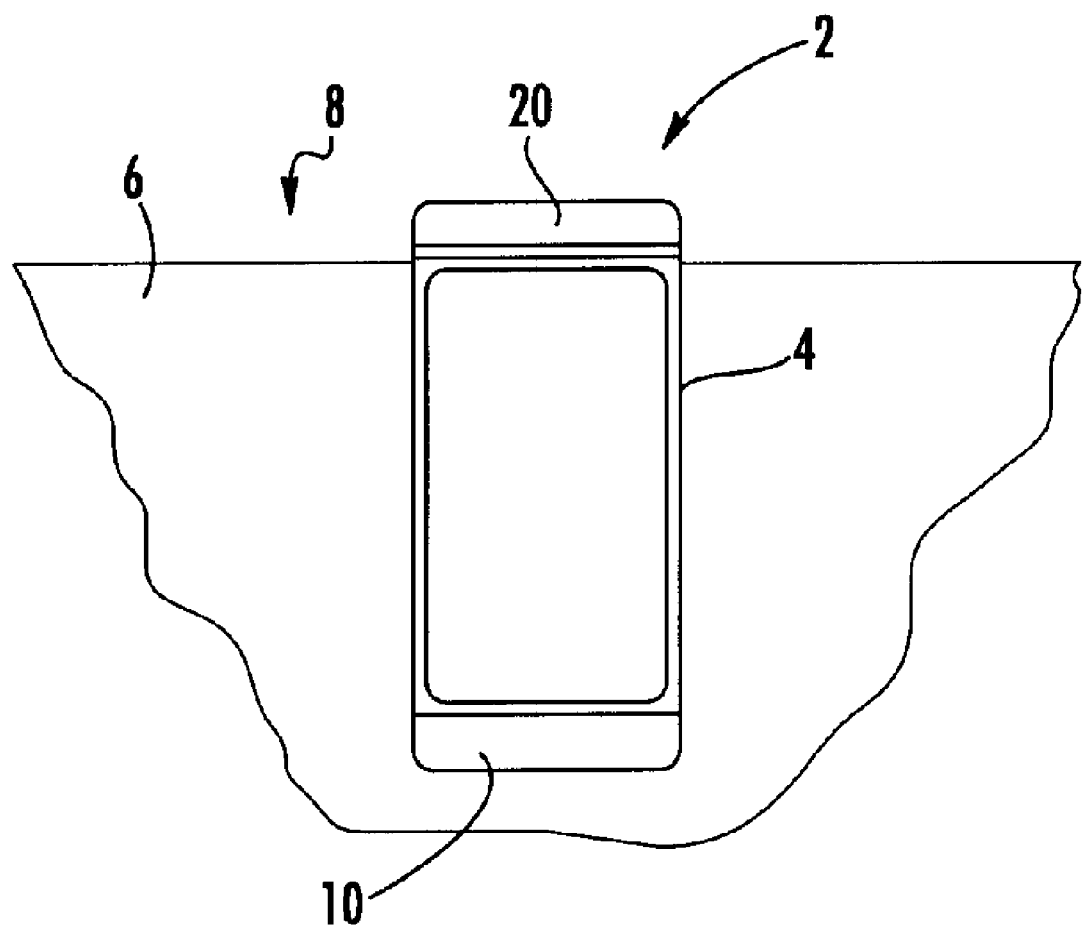
FIG. 1 illustrates a card made in accordance with the invention inserted within a slot of a host device such as a computer.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals in the drawings and specification refer to like elements throughout.

In FIG. 1 the card of the invention 2 is inserted into a slot 4 located within the housing 6 of an electronic device 8 such as a lap top computer, hand held computer, PDA or the like. As is known to those skilled in the art, a PCMCIA slot such as slot 4 is provided with a PCMCIA interface 10 that forms a male connector configured to engage a corresponding female connector 12 (shown in FIG. 2) of card 2. As will be understood, the female connector 12 of card 2 has a plurality of sockets (not shown) that are configured to receive corresponding pins (not shown) of the interface 10.

The interface pins are connected internally and electrically to a data processor within the electronic device 8, as is known by those skilled in the art, by a series of electrical connections, such as wires, printed circuit traces, or electrical ribbon (not shown). The sockets in the connector 12 of card 2 are electrically connected to a processor or other electronics in the card 2, as is known to those skilled in the art. When the connector 10 is electrically coupled to connector 12 of card 2, electrical signals can be exchanged between the card 2 and the electronic device 8. As is understood by those skilled in the art, the card 2 may be a radiotelephone card and include a radio telephone transceiver for transmitting and receiving radiotelephone communications to and from device 8. While card 2 has been specifically described as a radiotelephone card it is to be understood that the card 2 may comprise modems, sound cards, floppy disk controllers, hard drives, Global Positioning System (GPS) cards, local area network (LAN) cards, and pagers, among others. The mechanical structure of the card of the invention and the method of manufacturing the card of the invention can be applied to a card having any functionality and to other types of plug-in interfaces, peripherals or adapters both standardized and proprietary.

Figure 2:
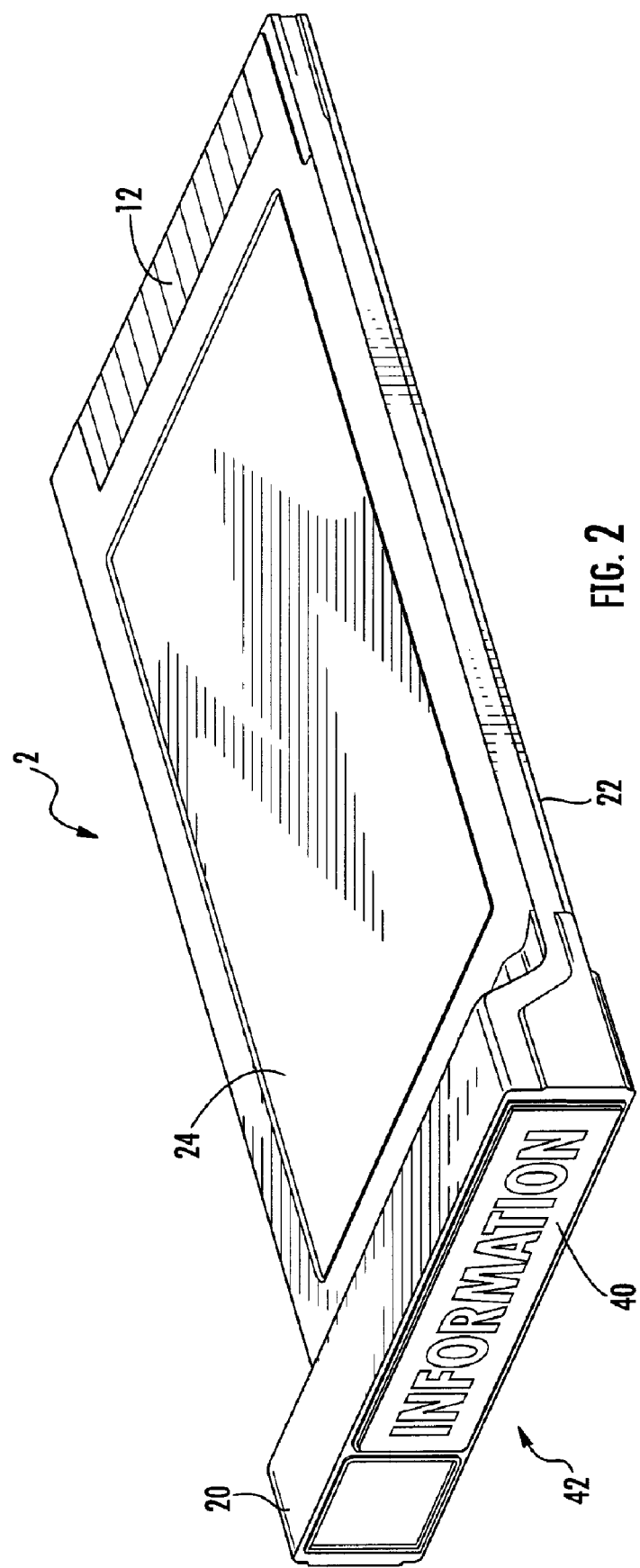
FIG. 2 is a perspective view of an embodiment of a card made in accordance with the invention.
Figure 3:
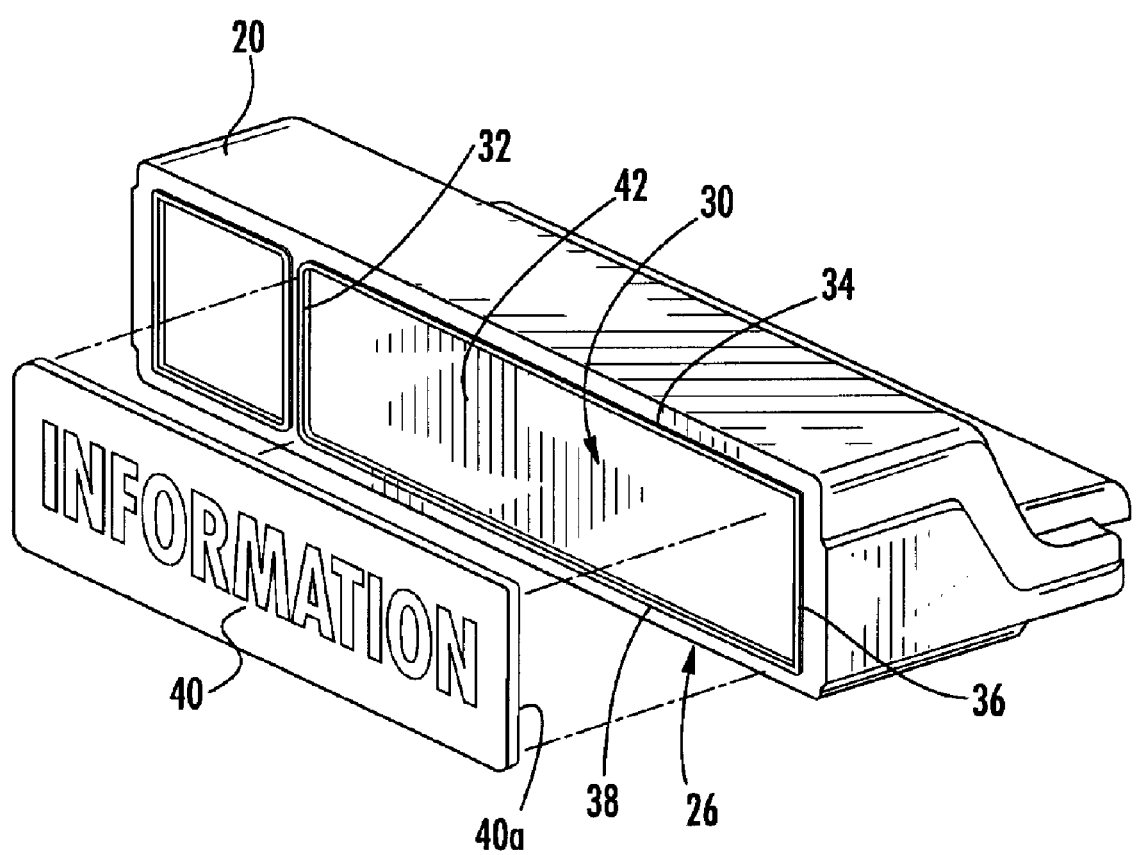
FIG. 3 is an exploded partial perspective view of the embodiment of the card of FIG. 2

Referring to FIGS. 2 and 3 a card made in accordance with the invention is shown generally at 2 and may include a frame formed of synthetic resin or the like and having an exposed extension 20. The frame supports a circuit board (not shown) encased between a lower cover 22 and an upper cover 24, where the covers may be made of a metal such as stainless steel. The circuit board is supported on a portion of the frame disposed between and protected by the upper cover 22 and lower cover 24 and has various sorts of circuit components mounted thereon for providing the card's functionality. The card is dimensioned to fit within the slot 4. In one embodiment female connector 12 is formed on an edge portion of the card on a side opposite extension 20 and along an insertion direction of the card such that connector 12 engages the corresponding male connector 10 of electronic device 8 into which the card is inserted.

The extension 20 includes a mounting area 26, as best shown in FIG. 3, for receiving the cover plate 40 comprising a recessed area 30 having a periphery defined by walls 32, 34, 36 and 38. In one embodiment the extension 20 and mounting area 26 are located externally of device 8 when card 2 is inserted in slot 4 as shown in FIG. 1. Cover plate 40 is dimensioned to be closely received within recessed area 30. Cover plate 40 may be made of a plastic material such as polypropylene or Low Density Polyethylene Resins (LDPE) or the like. Other materials may also be used for cover plate 40 that provide a cover plate that has some structural rigidity and that is similar in look and feel to the material of the extension 20. In one embodiment the cover plate 40 may be made of the same material as the extension 20. The recessed area 30 ensures that the cover plate 40 is properly aligned and seated on the extension 20. While recessed area 30 is shown and described it will be appreciated that other alignment mechanisms may be used such as tabs extending from one of either the extension 20 or cover plate 40 engaging with recesses or apertures formed on the other of the extension or cover plate. The cover plate 40 is permanently attached to the extension 20 by adhesive, double sided adhesive tape, sonic welding, a mechanical connection such as a snap fit engagement between the cover plate 40 and front face 42 of recessed area 32 or the like.

The cover plate 40 is manufactured with the customer-specific information 42 carried thereon prior to assembly to the card. The customer-specific information may include branding information such as customer logo, trademarks, customer name, color scheme or the like. The information may also include information such as part number, functional description or other information designated by the customer. In one embodiment the information is printed directly on the cover plate. The information could also be applied by a non-printing process such as etching or embossing. In another embodiment the cover plate could be made of transparent material and the information printed on the back surface 40a of the cover plate 40. It is to be understood that the back surface 40a of the cover plate 40 is the surface that faces front face 42. By printing the information on the back surface, the information is protected against wear by the cover plate itself. Finally, texture may be added to the cover plate 40 during the molding process of the cover plate where the texture is, or forms part of, a logo or other customer information.

Figure 4:
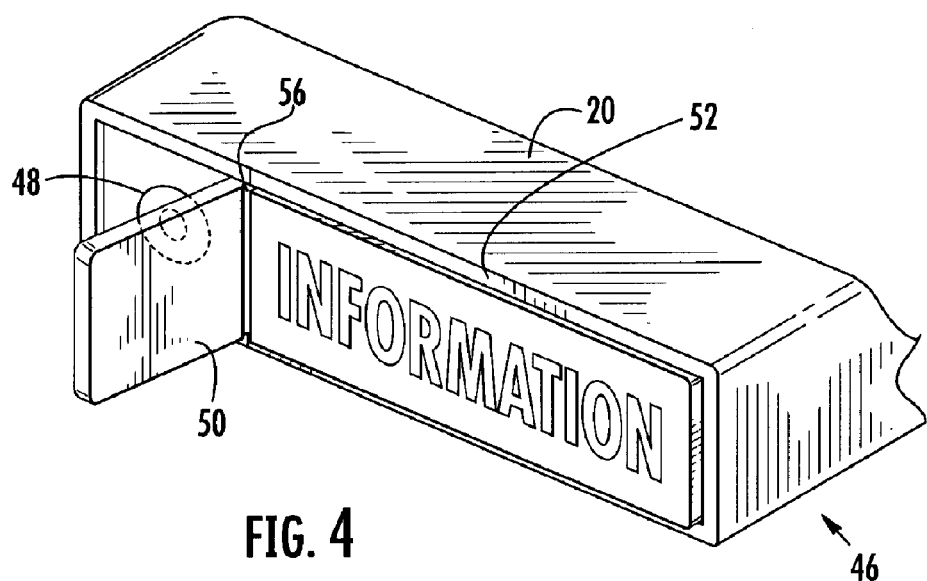
FIG. 4 is a partial perspective view of another embodiment of a card made in accordance with the invention.
Figure 5:
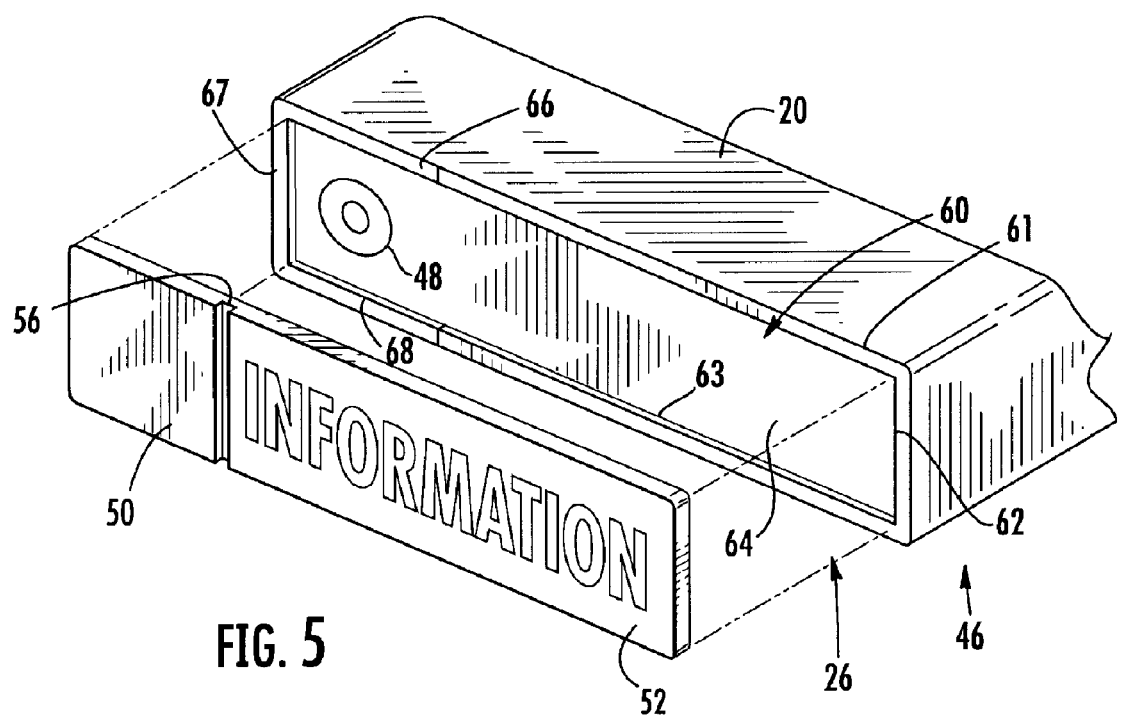
FIG. 5 is an exploded partial perspective view of the embodiment of the card of FIG. 4.

Another embodiment of the card of the invention is shown in FIGS. 4 and 5 and comprises a card 46 that includes an element 48 that is to be accessed by the end user during normal use of the card. For example, element 48 may include an RF connector, an adjustment knob, an antenna, a headphone connector, USB port, video input/output connector or other device as are commonly used on cards. It is desirable that the element 48 be selectively isolated from the external environment by a cover when not in use. In the embodiment shown in FIGS. 4 and 5 the cover 50 is made integrally with cover plate 52. Cover 50 is connected to cover plate 52 at hinge 56 such that the cover 50 can pivot relative to cover plate 52. In one embodiment hinge 56 is a living hinge that is integrally formed with the cover plate 52 and cover 50 of a single piece of molded plastic such as polypropylene or Low Density Polyethylene Resins (LDPE) or the like. Because this material is flexible, hinge 56 can be created by forming a relatively thin portion of material that acts as a flexible hinge. While the hinge 56 is shown as a flexible area of the material, it will be appreciated that the hinge may be a separate mechanical structure between cover 50 and cover plate 52.

The extension 20 has a recessed area 60 formed therein for receiving cover plate 52. Recessed area 60 is formed by extending walls 61, 62 and 63 formed on three sides thereof. The fourth side of recessed area 60 is not formed with an extending wall to allow the cover 50 and cover plate 56 to rest flush against the front face 64 of extension 20.

The cover plate 52 is located within recessed area 60 and is secured thereto by adhesive, double sided adhesive tape, sonic welding, a mechanical connection such as a snap fit engagement between the cover plate and front face 64. The cover 50 is not permanently secured to the frame such that it can be selectively opened and closed by the end user to expose element 48. The cover 50 may be held in the closed position by a friction fit between the side edges of the cover 50 and extending walls 66, 67 and 68 surrounding element 48. Other mechanisms for maintaining the cover 56 in the closed position may also be used including a mechanical lock or the like. Printed material is applied to cover plate 52 as previously described. Printed material may also be applied to the exterior or interior surfaces of cover 56.

Figure 6:
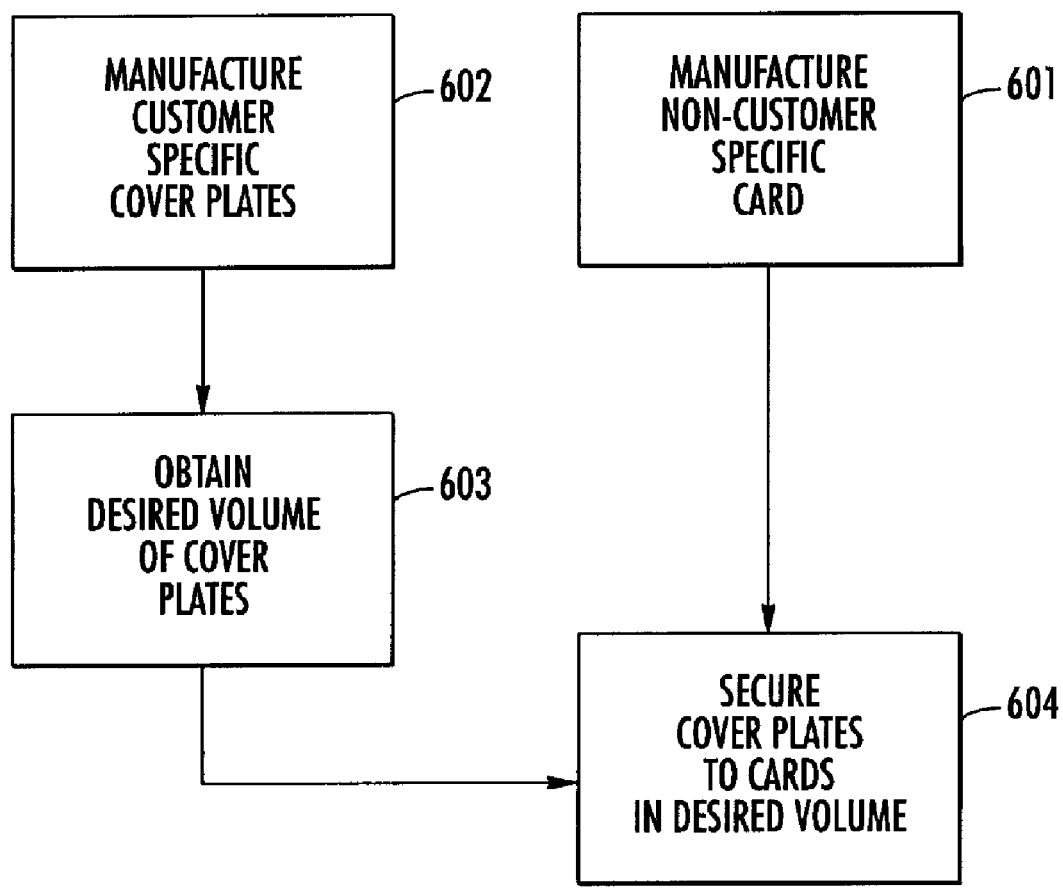
FIG. 6 is a block diagram showing a method of manufacturing the card of the invention.

The method for manufacturing the card of the invention will be described with reference to FIG. 6. Non-customer specific cards having an exposed extension 20 are manufactured (block 601). The cards as manufactured are fully functional and are ready for sale except for the addition of the customer specific information. The extension 20 is made with a mounting area for receiving the cover plate as previously described. The card may be manufactured without regard to the volume ordered by any specific customer. In this manner the card may be manufactured based on, for example, quarterly averages for the business as a whole and the manufacturing process does not have to be tailored to specific customer orders. The cover plates 40 and/or 52 are manufactured with the customer information per specific customer specifications separate from the interface cards (block 602). Because the cover plates are relatively inexpensive they can be manufactured in quantities unrelated to specific customer orders and maintained in inventory. Alternatively, because the cover plates are easy to manufacture, no inventory need be maintained and they can be manufactured only upon receipt of a specific order from the customer. In either event the invention disconnects the manufacture of the card from a specific customer thereby lowering manufacturing and inventory costs and facilitating design changes to the interface card and/or customer changes regarding branding information. Upon receipt of a customer order, the desired number of cover plates are manufactured and/or retrieved from inventory (block 603). The cover plates with the information pre-formed thereon are then attached to the interface cards to complete manufacture (block 604). The manufacturing process of the invention greatly reduces the lead time to provide customized customer information on a card.

Specific embodiments of an invention are disclosed herein. One of ordinary skill in the art will quickly recognize that the invention has other applications in other environments. Many embodiments are possible. The following claims are in no way intended to limit the scope of the invention to the specific embodiments described above.

What is claimed is:

1. A card comprising:
    a radio telephone transceiver;
    a frame encasing said radio telephone transceiver and having a portion defining an external mounting area such that said frame and said radio telephone transceiver define a fully functional card;
    a separate cover plate secured to said mounting area; and
    information provided on said cover plate.

2. The card of claim 1 wherein said information includes branding information.

3. The card of claim 1, wherein the information is printed on said cover plate.

4. The card of claim 1, wherein the information is embossed on said cover plate.

5. The card of claim 1, wherein the information is textured on said cover plate.

6. The card of claim 1, wherein the cover plate is permanently secured to the mounting area.

7. The card of claim 1, wherein the portion is the extension of an interface card.

8. The card of claim 1, wherein the portion and the cover plate are made of the same material.

9. The card of claim 1, wherein the cover plate is made of plastic material.

10. The card of claim 1, wherein the cover plate is made of a material having structural rigidity.

11. A method of making a card comprising:
    making a fully functional card having a processor and a connector for releasably connecting the processor to an electronic device to establish an electrical connection between the card and the electronic device where the processor is enclosed in a frame having a portion defining an external mounting area that is disposed external to the electronic device,
    making a cover plate,
    applying information to the cover plate, and
    securing the cover plate to the fully functional card.

12. A card comprising:
    a processor;
    a connector for releasably connecting the processor to an electronic device to establish an electrical connection between the card and the electronic device where a frame encases the processor and has a portion defining an external mounting area that is disposed external to the electronic device;
    a separate cover plate secured to said mounting area; and
    information provided on said cover plate.

13. The card of claim 12 wherein the card is a radiotelephone card.

14. The card of claim 12 wherein the card is a PC card.

15. A card comprising:
    a portion defining an external mounting area;
    a cover plate secured to said mounting area wherein a cover is pivotally attached to the cover plate wherein the cover covers an RF connector; and
    information provided on said cover plate.

16. A card comprising:
    a portion defining an external mounting area;
    an electronic element located adjacent the external mounting area;
    a cover plate secured to said mounting area wherein a cover is movably attached to the cover plate and selectively covers said electronic element; and
    information provided on said cover plate.

17. A card comprising:
    a radio telephone transceiver;
    a portion defining an external mounting area;
    a separate cover plate secured to said mounting area; and
    information provided on said cover plate wherein the cover plate is transparent and the information is on the side of the cover plate facing the mounting area and is located between the mounting area and the cover plate.

18. A card comprising:
    a radio telephone transceiver;
    a portion defining an external mounting area;

a separate cover plate secured to said mounting area wherein a cover is pivotally attached to the cover plate.; and information provided on said cover plate.

19. The card of claim 18, wherein the cover covers an electronic element.

20. The card of claim 18, wherein the cover is integrally formed with the cover plate.

21. A card comprising:

a radio telephone transceiver;

a portion defining an external mounting area;

a separate cover plate secured to said mounting area, wherein a cover is connected to the cover plate at a living hinge; and information provided on said cover plate.

* * * * *